United States Patent
Twari et al.

(10) Patent No.: US 7,116,539 B2
(45) Date of Patent: Oct. 3, 2006

(54) FAST CMOS MATCHED IMPEDANCE DC WRITE CURRENT DRIVER FOR PREAMPLIFIERS

(75) Inventors: Vineet Twari, San Jose, CA (US); Roberto Alini, Dublin, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 350 days.

(21) Appl. No.: 10/611,043

(22) Filed: Jul. 1, 2003

(65) Prior Publication Data

US 2005/0002144 A1    Jan. 6, 2005

(51) Int. Cl.
  *H02H 3/22* (2006.01)
  *H03K 3/00* (2006.01)
(52) U.S. Cl. ..................... 361/111; 327/112
(58) Field of Classification Search ............. 327/112; 326/85
See application file for complete search history.

(56) References Cited

U.S. PATENT DOCUMENTS

| | | | | |
|---|---|---|---|---|
| 5,418,478 A | * | 5/1995 | Van Brunt et al. | 326/86 |
| 5,869,988 A | * | 2/1999 | Jusuf et al. | 327/110 |
| 6,130,563 A | * | 10/2000 | Pilling et al. | 327/111 |
| 6,133,768 A | * | 10/2000 | Price et al. | 327/110 |
| 6,184,727 B1 | * | 2/2001 | Price, Jr. | 327/108 |
| 6,580,575 B1 | * | 6/2003 | Rafi et al. | 360/66 |

* cited by examiner

*Primary Examiner*—Brian Sircus
*Assistant Examiner*—Boris Benenson
(74) *Attorney, Agent, or Firm*—Lisa K. Jorgenson; Andre M. Szuwalski

(57) ABSTRACT

A driver circuit includes a CMOS stage and switch functionalities for performing certain tasks. One task is to selectively block exposure of the CMOS stage to reference voltage(s). Another task is to selectively protect the CMOS stage during transient operation. Yet another task is to block leakage current from flowing from the CMOS stage to ground.

32 Claims, 2 Drawing Sheets

US 7,116,539 B2

FAST CMOS MATCHED IMPEDANCE DC WRITE CURRENT DRIVER FOR PREAMPLIFIERS

BACKGROUND OF THE INVENTION

1. Technical Field of the Invention

The present invention relates to current drivers and, more particularly, to CMOS current drivers as used, for example, in amplifier or pre-amplifier circuits.

2. Description of Related Art

Reference is now made to FIG. 1 wherein there is shown a circuit diagram of a prior art current driver 10. The current driver includes a CMOS follower stage 12 comprising an n-channel transistor 14, having a transconductance gm, whose drain is connected to Vcc (+ve or positive reference) and a p-channel transistor 16, also having a transconductance gm, whose drain is connected to Vee (−ve or negative reference). The sources of the n-channel transistor 14 and p-channel transistor 16 are connected together. The gates of the n-channel transistor 14 and p-channel transistor 16 are also connected together to receive an input signal VDC (which is generated by a circuit 30 including a set of switches producing VDC with a value of either −2.7V (or other suitable negative voltage, such as, −2.0V) or +2.7 (or other suitable positive voltage, such as, +2.0V). The connected sources of the follower stage 12 transistors are further connected to a pure resistor R through which a current IDC (the DC driver current) flows toward a node 18. Connected between Vcc and node 18 is a first current source 20. A second current source 22 is connected between the node 18 and Vee. These current sources assist in the generation of current IOS which is the initial peak overshoot (OS) current. The IOS current exceeds in magnitude the settled DC current IDC of the driver. An output 24, at which an output voltage HW appears, is connected to node 18. The output current IW at output 24 is equal to the sum of the current IDC (provided from the resistor R) and the current IOS (provided by the first current source 20). The impedance Zout at the output 24 of the driver 10 is equal to the sum of the resistance value for the resistor R plus the value 1/gm for the driver transistor of the follower stage 12 when that transistor is on.

In many applications for the current driver 10, the illustrated circuit is only one-half of the overall current driver and a symmetrical circuit to that illustrated is also provided. In this configuration, while one current driver 10 is sourcing current, its partner current driver is sinking that current. Circuit configurations of this type are well known to those skilled in the art.

This current driver 10 implementation suffers from a number of drawbacks including speed limitations, safe operating area problems and wasted current during overshoot (OS) problems. There is accordingly a need for an improved circuit implementation for the current driver which addresses some or all of these problems, as well as other problems recognized by those skilled in the art.

SUMMARY OF THE INVENTION

In accordance with one embodiment of the present invention, a driver circuit is provided which includes CMOS stage and a switch functionality that selectively blocks exposure of the CMOS stage to reference voltage(s).

In accordance with another embodiment of the present invention, a driver circuit is provided which includes a CMOS stage and a switch functionality that selectively protects the CMOS stage during transient operation.

In accordance with another embodiment of the present invention, a driver circuit is provided which includes a CMOS stage and a switch functionality that blocks leakage current from flowing from the CMOS stage to ground.

In accordance with another embodiment, a driver circuit is provided which includes a CMOS stage and a switch functionality that selectively blocks exposure of the CMOS stage to reference voltage(s) and selectively protects the CMOS stage during transient operation. In a further embodiment, the driver circuit includes a switch functionality that blocks leakage current from flowing from the CMOS stage to ground.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 2:
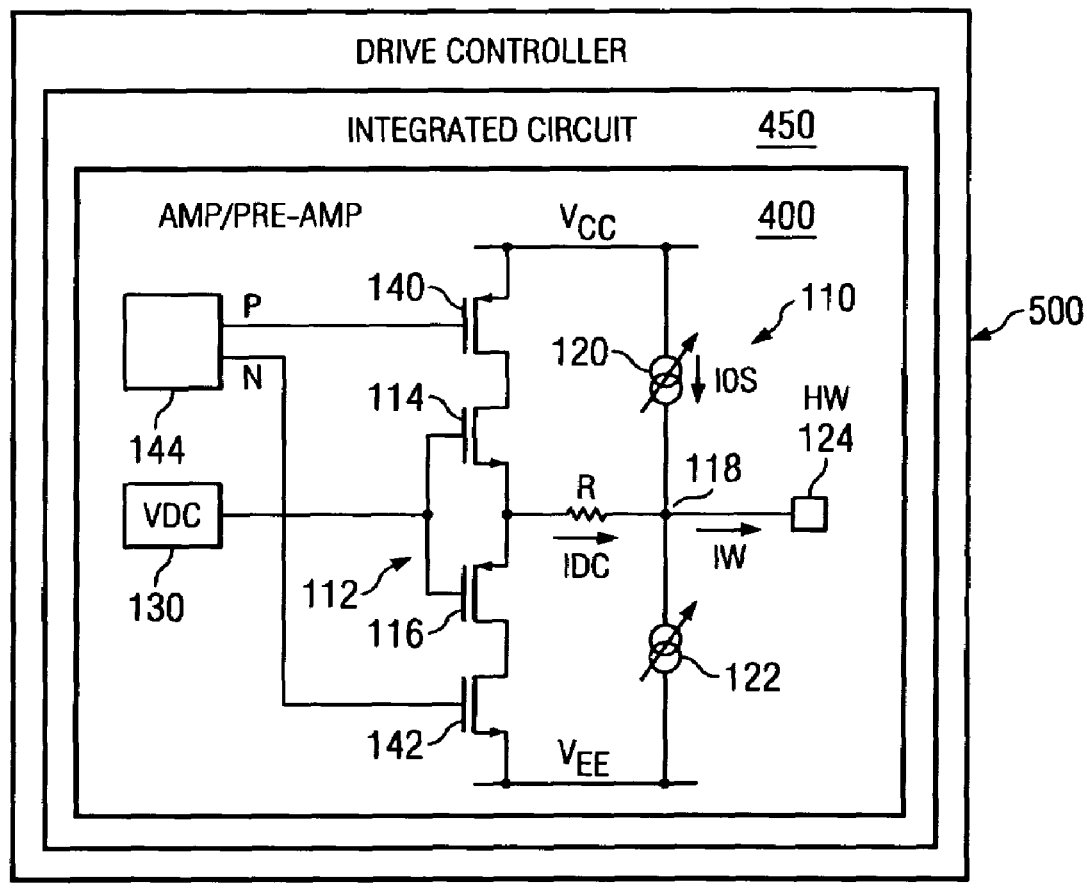
FIG. 2 is a circuit diagram of a first embodiment current driver in accordance with the present invention.

Reference is now made to FIG. 2 wherein there is shown a circuit diagram of a first embodiment current driver 110 in accordance with the present invention. The current driver includes a CMOS follower stage 112 comprising an n-channel transistor 114, having a transconductance gm, and a p-channel transistor 116, also having a transconductance gm. The sources of the n-channel transistor 114 and p-channel transistor 116 are connected together. The gates of the n-channel transistor 114 and p-channel transistor 116 are also connected together to receive an input signal VDC (which is generated by a circuit 130 including a set of switches producing VDC with a value of either −2.7V (or other suitable negative voltage, such as, −2.0V) or +2.7 (or other suitable positive voltage, such as, +2.0V). The connected sources of the follower stage 112 transistors are further connected to a pure resistor R through which a current IDC (the DC driver current) flows toward a node 118. Connected between Vcc (+ve or positive reference) and node 118 is a first current source 120. A second current source 122 is connected between the node 118 and Vee (−ve or negative reference). These current sources assist in the generation of a current IOS which is an initial peak overshoot (OS) current. The IOS current exceeds in magnitude the settled DC output current IDC of the driver. An output 124, at which an output voltage HW appears, is connected to node 118. The output current IW at output 124 is equal to the sum of the current IDC (provided from the resistor R) and the current IOS (provided by the first current source 120). The impedance Zout at the output 124 of the driver 110 is equal to the sum of the resistance value for the resistor R plus the value 1/gm for the driver transistor of the follower stage 112 when that transistor is on.

The driver 110 further includes a p-channel FET transistor 140 whose source is connected to Vcc and whose drain is connected to the drain (a stage path terminal) of the n-channel transistor 114 of the follower stage 112. The gate of the transistor 140 is connected to receive a control signal P. The driver still further includes an n-channel FET transistor 142 whose source is connected to Vee and whose drain (another stage path terminal) is connected to the drain of the p-channel transistor 116 of the follower stage 112. The gate of transistor 142 is connected to receive a control signal N. The control signals P and N are logic signals which are selectively generated by a control circuit 144 with correct timing depending on whether the output voltage HW must source or sink current.

Typical width/length dimensions for the transistors used in the current driver 110 are: transistor 112 (250 u/0.35 u); transistor 114 (750 u/0.35 u); transistor 140 (375 u/0.35 u); and transistor 142 (150 u/0.35 u).

Figure 1:
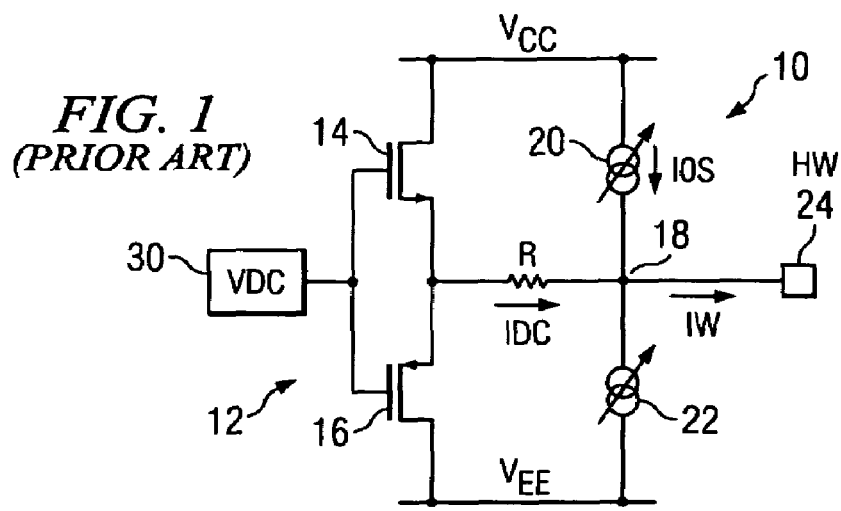
FIG. 1, previously described, is a circuit diagram for a prior art current driver.

As with the current driver 10 of FIG. 1, the current driver 110 is only one-half of the overall current driver and a symmetrical circuit to that illustrated is also provided connected in a manner well know to those skilled in the art. In this configuration, while one current driver 110 is sourcing current, its partner current driver is sinking that current. In operation, when this current driver 110 is sourcing current, the input VDC is a positive voltage typically between 1.3 and 2.7 volts and the current IDC may be 15–65 mA. The p-channel transistor 140 is conducting because the control circuit 144 is generating control signal P=0V and n-channel transistor 142 is off because the control circuit is generating control signal N=Vee (for example, −3.3V). Additionally, the n-channel transistor 114 is conducting, and the p-channel transistor 116 is strongly off due to the positive input VDC.

The current driver 110 is an improvement over the current driver 10 because the transistors 140 and 142 act as switches which, when open, help to prevent the transistors 114 and 116 from being directly exposed to Vcc or Vee. This assists the current driver 110 in protecting the transistors 114 and 116 from breakdown.

Notwithstanding the improvement(s), there are some drawbacks experienced with the current driver 110. First, since VDC has to swing between +2.7V and −2.7V (worst case), the current driver 110 has a speed limitation because one of transistor 114 or transistor 116 is not switched off instantaneously while the other begins conducting. Additionally, the transistors 140 and 142 see a drain to source and gate to drain voltage more than double their breakdown values. When the voltage at the output 124 is going positive, the drain of transistor 142 tends to follow the output voltage and transistor 142 breaks down because transistor 116 is not completely off. Similarly, the transistor 140 will break down when the output voltage goes negative. Thus, while the transistors 140 and 142 assist in protecting the transistors 114 and 116 during DC, there continues to be a breakdown risk during transients.

Figure 3:
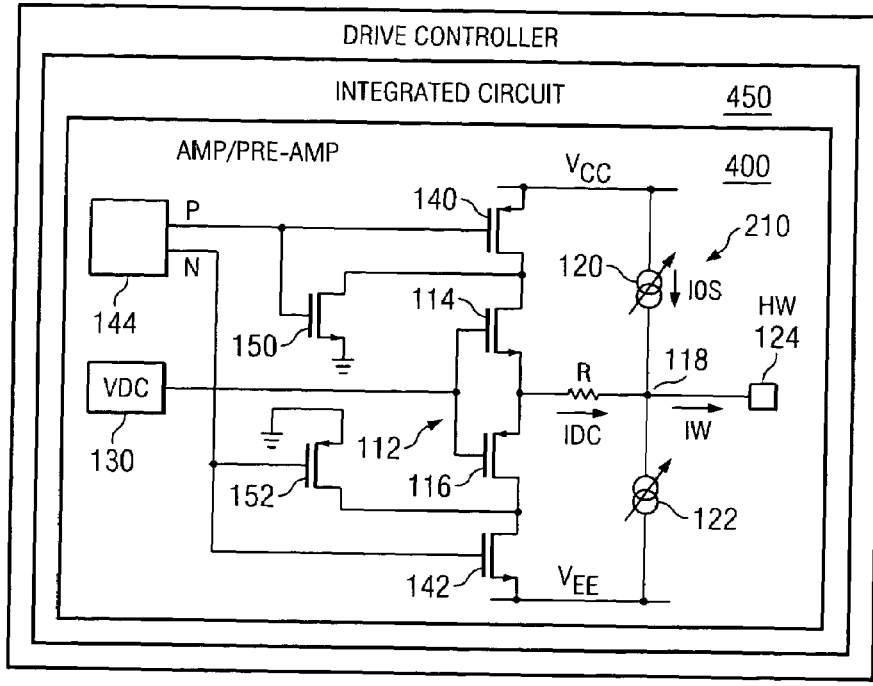
FIG. 3 is a circuit diagram of a second embodiment current driver in accordance with the present invention.

Reference is now made to FIG. 3 where a solution is presented to the drawbacks experienced with the current driver 110. FIG. 3 is a circuit diagram for a second embodiment of a current driver 210 in accordance with the present invention (like reference numbers in FIG. 3 refer to like/similar components in FIG. 2).

The current driver 210 further includes an n-channel FET transistor 150 whose drain is connected to the connected drains of the transistors 114 and 140. The gate of the transistor 150 is connected to receive the control signal P. The source of the transistor 150 is connected to ground. The current driver 210 still further includes a p-channel FET transistor 152 whose drain is connected to the connected drains of the transistors 116 and 142. The gate of the transistor 152 is connected to receive the control signal N. The source of the transistor 152 is connected to ground.

Typical width/length dimensions for the transistors used in the current driver 210 are: transistor 112 (250 u/0.35 u); transistor 114 (750 u/0.35 u); transistor 140 (375 u/0.35 u); transistor 142 (150 u/0.35 u); transistor 150 (150 u/0.35 u); and transistor 152 (375 u/0.35 u).

As with the current driver 10 of FIG. 1, the current driver 210 is only one-half of the overall current driver and a symmetrical circuit to that illustrated is also provided and connected in a manner well known to those skilled in the art. In this configuration, while one current driver 210 is sourcing current, its partner current driver is sinking that current. In operation, when this current driver 210 is sourcing current, the input VDC is a positive voltage typically between 1.3 and 2.7 volts and the current IDC may be 15–65 mA. The p-channel transistor 140 is conducting because the control circuit 144 generates control signal P=0V and n-channel transistor 142 is off because the control circuit 144 generates control signal N=Vee (for example, −3.3V). Additionally, the n-channel transistor 114 is conducting, and the p-channel transistor 116 is strongly off because VDC is positive. When transistors 114 and 140 are conducting or begin to conduct (i.e., during transient conditions), the transistor 152 forces ground to be applied to the drain of transistor 142, thus protecting it from breakdown as described above. Similarly, when transistors 116 and 142 are conducting or begin to conduct (transient conditions), the transistor 150 forces ground to be applied to the drain of transistor 140, thus protecting it from breakdown as described above.

The current driver 210 is an improvement over the current driver 110 because the transistors 150 and 152 act as switches which, when closed, help to prevent the transistors 114 and 116 from breakdown during transient operation.

Notwithstanding the improvement(s), there are some drawbacks experienced with the current driver 210. First, since VDC has to swing between +2.7V and −2.7V (worst case), the current driver 210 has a speed limitation because one of transistor 114 or transistor 116 is not switched off instantaneously while the other begins conducting. Additionally, overshoot (OS) current from the current sources is partially leaked to ground either through transistors 114 and 150 when the voltage at the output 124 is going negative or through transistors 116 and 152 when the voltage at the output 124 is going positive. This leakage occurs because one of the transistors 114 or 116 is not completely off while the other of the transistors is going on.

Figure 4:
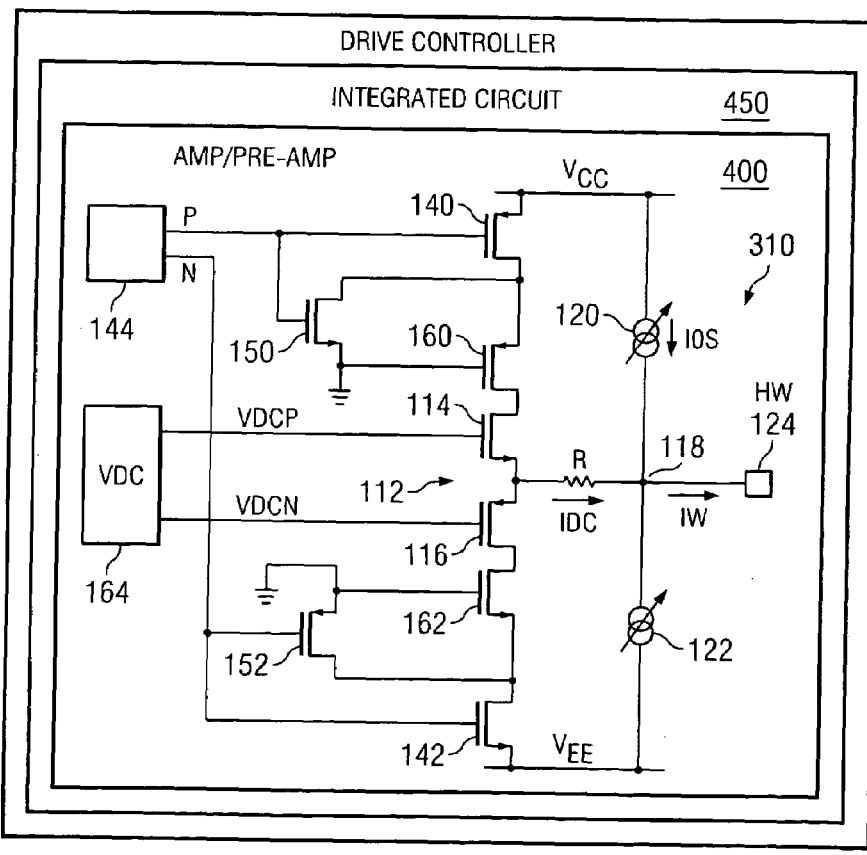
FIG. 4 is a circuit diagram of a third embodiment current driver in accordance with the present invention.

Reference is now made to FIG. 4 where a solution is presented to the drawbacks experienced with the current driver 210. FIG. 4 is a circuit diagram for a third embodiment of a current driver 310 in accordance with the present invention (like reference numbers in FIG. 4 refer to like/similar components in FIGS. 2 and 3).

The current driver 310 further includes a p-channel FET transistor 160 in cascode configuration between the transistors 114 and 140. The gate of transistor 160 is connected to ground. The current driver 310 still further includes an n-channel FET transistor 162 in cascode configuration between the transistors 116 and 142. The gate of transistor 162 is connected to ground.

It will, of course be recognized that the cascode configuration of the transistor 160 may alternatively place the transistor 140 between transistors 114 and 160. Similarly, the cascode configuration of the transistor 162 may alternatively place the transistor 142 between transistors 116 and 162.

Typical width/length dimensions for the transistors used in the current driver 310 are: transistor 114 (250 u/0.35 u); transistor 116 (750 u/0.35 u); transistor 140 (500 u/0.35 u); transistor 142 (200 u/0.35 u); transistor 150 (10 u/0.35 u); transistor 152 (30 u/0.35 u); transistor 160 (500 u/0.35 u); and transistor 162 (200 u/0.35 u).

As with the current driver 10 of FIG. 1, the current driver 310 is only one-half of the overall current driver and a symmetrical circuit to that illustrated is also provided and connected in a manner well know to those skilled in the art. In this configuration, while one current driver 310 is sourcing current, its partner current driver is sinking that current. In operation, when this current driver 310 is sourcing current, the input VDC is a positive voltage typically between 1.3 and 2.7 volts and the current IDC may be 15–65 mA. The p-channel transistor 140 is conducting because the control circuit 144 generates control signal P=0V and n-channel transistor 142 is off because the control circuit 144 generates control signal N=Vee (for example, −3.3V). Additionally, the n-channel transistor 114 is conducting, and the p-channel transistor 116 is off because VDC is positive. However, transistor 116 need not be strongly off while transistor 114 is going on because any leakage current to ground will be blocked by transistor 162. Conversely, when the p-channel transistor 116 is going on, the n-channel transistor 114 need not be strongly off because transistor 160 blocks leakage current to ground.

Advantageously, the blocking of the leakage current as described above obviates the need to bias the gate of transistor 116 to a negative voltage (when VDC is negative) or bias the gate of the transistor 114 to a positive voltage (when VDC is positive). Because of this, the gates of the follower 112 can be separated and the input signal VDC can be supplied as two components: VDCP (which is either positive VDC or ground) and VDCN (which is either negative VDC or ground). A circuit 164 is provided for generating VDCP/VDCN where a first set of switches generates VDCP with a value of +2.7V (or other suitable positive voltage, such as, +2.0V) or 0V and a second set of switches generates VDCN with a value of 0V or −2.7V (or other suitable negative voltage, such as, −2.0V).

The current driver 310 is an improvement over the current driver 210 because it supports half swing operation of VDC. For example, VDCP need only swing between +2.7V and ground (worst case) and VDCN need only swing between −2.7V and ground (worst case) instead of having to full swing −2.7V to +2.7V. Because of this, the VDCP and VDCN signals can reach desired values more quickly than if required to perform a full −2.7V to +2.7V swing as with the implementations of FIGS. 1–3. Additionally, there is no leakage of OS current to ground because of the blocking effects provided by transistors 160 and 162. Still further, transistors 150 and 152 can be very small transistors, as discussed above, in comparison to their implementation in FIG. 3. Additionally, transistors 160 and 162 can be relatively large transistors, as discussed above, without impacting switching power dissipation. Furthermore, the driver is a low power device and no quiescent current is needed. Also, the driver is fully CMOS thus obviating the need for bi-polar devices which cost extra masks during fabrication and introduce quiescent current issues. Finally, the driver possesses matched impedance during DC, with signal reflection being subdued if received after overshoot and during DC operation.

The driver circuits of the present invention may advantageously be used in amplifier and pre-amplifier (collectively, reference 400) implementations. More specifically, the driver circuit of the present invention may be used in a pre-amplifier integrated circuit chip 450 used in a hard disk drive controller 500. In this application, the output current possesses a desired waveshape and is passed through an inductive head which generates a magnetic field for writing information on the hard disk media. A typical waveshape for such an application has a fast rise time (about 400 ps), a peak current (overshoot) of about 90 mA, and a DC current of about 40 mA. The driver of the present invention is particularly useful in helping to produce the required DC current.

While the driver of the present invention may be implemented in discrete components, it is preferable for the circuit to be fabricated as an integrated circuit.

While the CMOS stage 112 is illustrated as a follower, it will be recognized by those skilled in the art that for a given application the CMOS stage may instead be implemented as an inverter with a well known CMOS configuration.

As used herein, the term "connected" refers to a direct electrical connection. As used herein, the term "coupled" refers to either a direct or an indirect electrical connection. While the driver of the present invention has been illustrated and described in terms of "connected" components, it will be recognized by those skilled in the art that this is for ease of illustration and simplification purposes, and that a direct electrical connection of the components is not necessarily required in order to achieve the operational benefits described herein.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A driver circuit, comprising:
   a CMOS stage having an input and an output, and a first path terminal and a second path terminal;
   a first switch coupled between a positive reference and the first path terminal, the first switch operating responsive to a first control signal to selectively block exposure of the CMOS stage to the positive reference;
   a second switch coupled between a negative reference and the second path terminal, the second switch operating responsive to a second control signal to selectively block exposure of the CMOS stage to the negative reference;
   a third switch coupled between the first path terminal and ground and operating responsive to the first control signal to selectively protect the CMOS stage during transient operation;
   a fourth switch coupled between the second path terminal and ground and operating responsive to the second control signal to selectively protect the CMOS stage during transient operation;
   a first current source coupled between the positive reference and the CMOS stage output; and
   a second current source coupled between the negative reference and the CMOS stage output.

2. The driver circuit of claim 1 wherein the CMOS stage comprises a CMOS follower.

3. The driver circuit of claim 1 wherein the CMOS stage input comprises a positive voltage input and a negative voltage input.

4. The driver circuit of claim 1 wherein the first and second switches comprise FETs.

5. The driver circuit of claim 1 wherein the first and second current sources are coupled to the CMOS stage output through a resistor.

6. The driver circuit of claim 1 wherein the first, second, third and fourth switches comprise FETs.

7. The driver circuit of claim 1 wherein the driver circuit is implemented as an integrated circuit.

8. The driver circuit of claim 1 wherein the driver circuit is used within an amplifier/preamplifier.

9. The driver circuit of claim 8 wherein the amplifier/preamplifier is part of a disk driver controller.

10. A driver circuit, comprising
a CMOS stage having an input and an output, and a first path terminal and a second path terminal;
a first switch coupled between a positive reference and the first path terminal, the first switch operating responsive to a first control signal to selectively block exposure of the CMOS stage to the positive reference;
a second switch coupled between a negative reference and the second path terminal, the second switch operating responsive to a second control signal to selectively block exposure of the CMOS stage to the negative reference;
a third switch series coupled with the first switch between the positive reference and the first path terminal, the third switch blocking leakage current from the first path terminal to ground;
a fourth switch series coupled with the second switch between the negative reference and the second path terminal, the third switch blocking leakage current from the second path terminal to ground;
a first current source coupled between the positive reference and the CMOS stage output; and
a second current source coupled between the negative reference and the CMOS stage output.

11. The driver circuit of claim 10 wherein the first, second, third and fourth switches comprise FETs.

12. The driver circuit of claim 10 further including:
a fifth switch coupled between ground and the series coupled first and third switches and operating responsive to the first control signal to selectively protect the CMOS stage during transient operation; and
a sixth switch coupled between ground and the series coupled second and fourth switched and operating responsive to the second control signal to selectively protect the CMOS stage during transient operation.

13. The driver circuit of claim 12 wherein the first, second, third, fourth, fifth and sixth switches comprise FETs.

14. The driver circuit of claim 10 wherein the CMOS stage comprises a CMOS follower.

15. The driver circuit of claim 10 wherein the first and second current sources are coupled to the CMOS stage output through a resistor.

16. The driver circuit of claim 10 wherein the driver circuit is implemented as an integrated circuit.

17. The driver circuit of claim 10 wherein the driver circuit is used within an amplifier/preamplifier.

18. The driver circuit of claim 17 wherein the amplifier/preamplifier is part of a disk driver controller.

19. A driver circuit, comprising:
a CMOS stage having an input and an output, and a first path terminal and a second path terminal;
a first p-channel transistor whose source is coupled to a positive reference, whose drain is coupled to the first path terminal and whose gate is coupled to receive a first control signal, the first p-channel transistor operating responsive thereto to selectively block exposure of the CMOS stage to the positive reference;
a first n-channel transistor whose source is coupled to a negative reference, whose drain is coupled to the second path terminal and whose gate is coupled to receive a second control signal, the first n-channel transistor operating responsive thereto to selectively block exposure of the CMOS stage to the negative reference;
a second p-channel transistor whose source is coupled to ground, whose drain is coupled to the second path terminal and whose gate is coupled to receive the second control signal, the second p-channel transistor operating responsive thereto to selectively protect the CMOS stage during transient operation;
a second n-channel transistor whose source is coupled to ground, whose drain is coupled to the first path terminal and whose gate is coupled to receive the first control signal, the second n-channel transistor operating responsive thereto to selectively protect the CMOS stage during transient operation;
a first current source coupled between the positive reference and the CMOS stage output; and
a second current source coupled between the negative reference and the CMOS stage output.

20. The driver circuit of claim 19 wherein the CMOS stage comprises a CMOS follower.

21. The driver circuit of claim 19 wherein the first and second current sources are coupled to the CMOS stage output through a resistor.

22. The driver circuit of claim 19 wherein the driver circuit is implemented as an integrated circuit.

23. The driver circuit of claim 19 wherein the driver circuit is used within an amplifier/preamplifier.

24. The driver circuit of claim 20 wherein the amplifier/preamplifier is part of a disk driver controller.

25. A driver circuit, comprising:
a CMOS stage having an input and an output, and a first path terminal and a second path terminal;
a first cascode circuit comprising a pair of p-channel transistors, the cascode circuit having a source coupled to a positive reference, a drain coupled to the first path terminal and a first interconnection node, wherein a first gate of one p-channel transistor in the first cascode circuit is coupled to receive a first control signal and a second gate of another p-channel transistor in the first cascode circuit is coupled to ground, the first cascode circuit operating responsive to the first control signal to selectively block exposure of the CMOS stage to the positive reference and further operating to block leakage current from the first path terminal;
a second cascode circuit comprising a pair of n-channel transistors, the cascode circuit having a source coupled to a negative reference, a drain coupled to the second path terminal and a second interconnection node, wherein a first gate of one n-channel transistor in the second cascode circuit is coupled to receive a second control signal and a second gate of another n-channel transistor in the second cascode circuit is coupled to ground, the second cascode circuit operating responsive to the second control signal to selectively block exposure of the CMOS stage to the negative reference and further operating to block leakage current from the second path terminal;
a first current source coupled between the positive reference and the CMOS stage output; and
a second current source coupled between the negative reference and the CMOS stage output.

26. The driver circuit of claim 25, further including:
a first p-channel transistor whose source is coupled to ground, whose drain is coupled to the second interconnection node and whose gate is coupled to receive the second control signal, the first p-channel transistor operating responsive thereto to selectively protect the CMOS stage during transient operation;
a first n-channel transistor whose source is coupled to ground, whose drain is coupled to the first interconnection node and whose gate is coupled to receive the first control signal, the first n-channel transistor operating responsive thereto to selectively protect the CMOS stage during transient operation.

27. The driver circuit of claim 26 wherein the CMOS stage comprises a CMOS follower.

28. The driver circuit of claim 26 wherein the CMOS stage input comprises a positive voltage input and a negative voltage input.

29. The driver circuit of claim 26 wherein the first and second current sources are coupled to the CMOS stage output through a resistor.

30. The driver circuit of claim 26 wherein the driver circuit is implemented as an integrated circuit.

31. The driver circuit of claim 26 wherein the driver circuit is used within an amplifier/preamplifier.

32. The driver circuit of claim 31 wherein the amplifier/preamplifier is part of a disk driver controller.

* * * * *